(12) United States Patent
Lu et al.

(10) Patent No.: US 12,366,346 B2
(45) Date of Patent: *Jul. 22, 2025

(54) LED LIGHTING DEVICE (71) Applicant: Xiamen PVTECH Co., Ltd., Fujian (CN)

(72) Inventors: Fuxing Lu, Fujian (CN); Rongtu Liu, Fujian (CN); Huibao Luo, Fujian (CN); Zehu Dai, Fujian (CN); Liangliang Cao, Fujian (CN); Chun Ming Liu, Fujian (CN)

(73) Assignee: Xiamen PVTECH Co., Ltd., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/916,716

(22) Filed: Oct. 16, 2024

(65) Prior Publication Data

US 2025/0035289 A1 Jan. 30, 2025

Related U.S. Application Data

(63) Continuation-in-part of application No. 18/138,146, filed on Apr. 24, 2023, now Pat. No. 12,146,621.

(51) Int. Cl.
| | |
|---|---|
| *F21V 19/00* | (2006.01) |
| *F21V 23/02* | (2006.01) |
| *F21V 23/06* | (2006.01) |
| *F21V 31/00* | (2006.01) |
| *F21Y 103/10* | (2016.01) |
| *F21Y 115/10* | (2016.01) |

(52) U.S. Cl.
CPC .......... *F21V 19/0025* (2013.01); *F21V 23/02* (2013.01); *F21V 23/06* (2013.01); *F21V 31/005* (2013.01); *F21Y 2103/10* (2016.08); *F21Y 2115/10* (2016.08)

(58) Field of Classification Search
CPC ............ F21K 9/27–278; F21S 4/20–28; F21V 19/001–0095; F21V 23/02–06; F21V 31/005–04; F21Y 2103/10; F21Y 2115/10
See application file for complete search history.

(56) References Cited

U.S. PATENT DOCUMENTS

| | | |
|---|---|---|
| 8,192,054 B2 | 6/2012 | Grajcar |
| 10,731,805 B2 * | 8/2020 | Li ............................ F21S 4/24 |
| 11,898,708 B1 | 2/2024 | Lu |

(Continued)

*Primary Examiner* — Jason M Han
(74) *Attorney, Agent, or Firm* — Winston Hsu (57) ABSTRACT

An LED lighting device includes a power supplier, a light cover and a circuit board. The circuit board is disposed in the light cover. The circuit board has a protective layer disposed thereon and a plurality of light sources. The circuit board has a front soldering section, a rear soldering section and a circuit section. The light sources are disposed on the circuit section and electrically connected to the circuit section. The protective layer includes an opening and two coated layers. The opening includes a front section, a rear section and a connecting section. The coated layers are disposed on the two sides of the connecting section respectively. The light sources are within the connecting section. The inner space of the light cover serves as an optical zone, such that the optical zone covers the front soldering section and the rear soldering section.

10 Claims, 10 Drawing Sheets

(56) References Cited

U.S. PATENT DOCUMENTS

| | | |
|---|---|---|
| 2010/0061089 A1 | 3/2010 | Lin |
| 2013/0051070 A1 | 2/2013 | Wu |
| 2015/0043205 A1 | 2/2015 | Wei |
| 2017/0089521 A1 | 3/2017 | Jiang |
| 2018/0049318 A1 | 2/2018 | Maki |

* cited by examiner

LED LIGHTING DEVICE

CROSS REFERENCE TO RELATED APPLICATIONS

This application is a continuation-in-part of U.S. application Ser. No. 18/138,146, filed on Apr. 24, 2023. The content of the application is incorporated herein by reference.

BACKGROUND OF THE INVENTION

1. Field of the Invention

The present invention relates to a lighting device, in particular to an LED lighting device.

2. Description of the Prior Art

LED (light-emitting diode) light tubes have many advantages, such as high efficiency, low power consumption, long service life, etc., so LED light tubes have been comprehensively applied to various buildings. However, currently available LED light tubes still have many shortcomings to be overcome.

For example, the circuit board (printed circuit) of a currently available LED light tube has a protective layer (ink) for providing the insulating function and protecting the traces on the circuit board. However, the protective layer usually has a lot of openings and a plurality of LEDs are disposed in these openings respectively (for instance, U.S. patent Ser. No. 10/670,197 adopts the protective layer having the above design). Therefore, the coating process of the protective layer is very complicated and the halogen elements of the protective layer tend to move to the soldering sections of the circuit board. Accordingly, the soldering sections are prone to be oxidized, and the conductivity and the soldering effect thereof may be influenced during the manufacturing process.

In addition, the currently available LED light tubes do not have a proper optical structure design, so the overall light-emitting areas of these lighting devices are limited can be significantly increased. Therefore, the light efficiency of these LED lighting devices is low.

SUMMARY OF THE INVENTION

One embodiment of the present invention provides a light-emitting diode (LED) lighting device, which includes a power supplier, a light cover and a circuit board. The circuit board is disposed in the light cover. The circuit board has a protective layer disposed thereon and a plurality of light sources. The circuit board has a front soldering section, a rear soldering section and a circuit section. The front soldering section is electrically connected to the rear soldering section via the circuit section, and the front soldering section and the rear soldering section are electrically connected to the power supplier. The light sources are disposed on the circuit section and electrically connected to the circuit section. The protective layer includes an opening and two coated layers. The opening includes a front section, a rear section and a connecting section. The front section is connected to the rear section via the connecting section, and the coated layers are disposed on the two sides of the connecting section respectively. The light sources are within the connecting section to serve as a light-emitting zone. The light-emitting zone makes the inner space of the light cover form an optical zone, such that the optical zone simultaneously covers the light-emitting zone, the front soldering section and the rear soldering section.

In one embodiment, the front section is connected to the rear section via the connecting section, such that the opening can be H-shaped.

In one embodiment, the LED lighting device further includes a plurality of light sources disposed on the circuit board and within the connecting section.

In one embodiment, the light sources are LEDs or an LED light strip.

In one embodiment, the LED lighting device further includes two end caps and a power supplier. The two end caps are disposed at two ends of the light cover and the power supplier is disposed in one of the end caps.

In one embodiment, the connecting section includes a plurality of bending portions and a plurality of connecting portions connected to each other.

In one embodiment, the bending portions and the connecting portions are arranged in alternating order.

In one embodiment, the shape of the bending portion is U-shaped or inverted U-shaped.

In one embodiment, each of the bending portions includes at least one vertical portion and a horizontal portion connected to each other and perpendicular to each other.

In one embodiment, the width of the horizontal portion is greater than the width of the connecting portion.

In one embodiment, the light cover is made of a transparent material or a semi-transparent material.

The LED lighting device in accordance with the embodiments of the present invention may have the following advantages:

(1) In one embodiment of the present invention, the LED lighting device includes a power supplier, a light cover and a circuit board. The circuit board is disposed in the light cover. The circuit board has a protective layer disposed thereon and a plurality of light sources. The circuit board has a front soldering section, a rear soldering section and a circuit section. The front soldering section is electrically connected to the rear soldering section via the circuit section, and the front soldering section and the rear soldering section are electrically connected to the power supplier. The light sources are disposed on the circuit section and electrically connected to the circuit section. The protective layer includes an opening and two coated layers. The opening includes a front section, a rear section and a connecting section. The front section is connected to the rear section via the connecting section, and the coated layers are disposed on the two sides of the connecting section respectively. The light sources are within the connecting section to serve as a light-emitting zone. The light-emitting zone makes the inner space of the light cover form an optical zone, such that the optical zone simultaneously covers the light-emitting zone, the front soldering section and the rear soldering section. Via the above optical structure design, the optical zone of the light cover can be further extended to cover the front soldering section and the rear soldering section of the circuit board, which can further expand the optical zone of the light cover. Thus, the overall light-emitting area of the LED lighting device can be significantly increased, so the light efficiency of the LED lighting device can be enhanced.

(2) In one embodiment of the present invention, the structure design of the protective layer makes the protection layer have only one opening. Therefore, the coating process of the protective layer can be significantly simplified, such that the manufacturing cost of the LED lighting device can be greatly reduced.

(3) In one embodiment of the present invention, any one of the coated layers of the protective layer is separated from the front soldering section by a predetermined distance and any one of the coated layers of the protective layer is separated from the rear soldering section by the predetermined distance. The above structural design can avoid that the halogen elements of the protective layer move to the front soldering section and the rear soldering section of the circuit board. As a result, the front soldering section and the rear soldering section of the circuit board will not be oxidized, which can make sure that the front soldering section and the rear soldering section of the circuit board can achieve great conductivity and soldering effect during the manufacturing process.

(4) In one embodiment of the present invention, the structure of the protective layer can be applied to various LED lighting devices (e.g., LED light tube, LED panel light, LED ceiling light, etc.) so as to achieve great technical effect. Therefore, the structure of the protective layer can be more comprehensively in application and more flexible in use.

(5) In one embodiment of the present invention, the circuit board of the LED lighting device further includes a multi-function layer, which covers the opening of the protective layer and the light sources disposed on the circuit board. The multi-function layer can provide antioxidant function, insulating function, light reflecting function and moisture-proof function. Thus, the reliability of the LED lighting device can be enhanced in order to improve the overall quality of the LED lighting device.

(6) In one embodiment of the present invention, the LED lighting device further has a dimming switch and/or a color temperature switch. Thus, the user can adjust the color temperature of the LED lighting device by operating the color temperature switch or adjust the brightness of the LED lighting device by operating the dimming switch. Accordingly, the LED lighting device can be more convenient in use.

Further scope of applicability of the present application will become more apparent from the detailed description given hereinafter. However, it should be understood that the detailed description and specific examples, while indicating exemplary embodiments of the present invention, are given by way of illustration only, since various changes and modifications within the spirit and scope of the present invention will become apparent to those skilled in the art from this detailed description.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention will become more fully understood from the detailed description given herein below and the accompanying drawings which are given by way of illustration only, and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. It should be understood that, when it is described that an element is "coupled" or "connected" to another element, the element may be "directly coupled" or "directly connected" to the other element or "coupled" or "connected" to the other element through a third element. In contrast, it should be understood that, when it is described that an element is "directly coupled" or "directly connected" to another element, there are no intervening elements.

Figure 1:
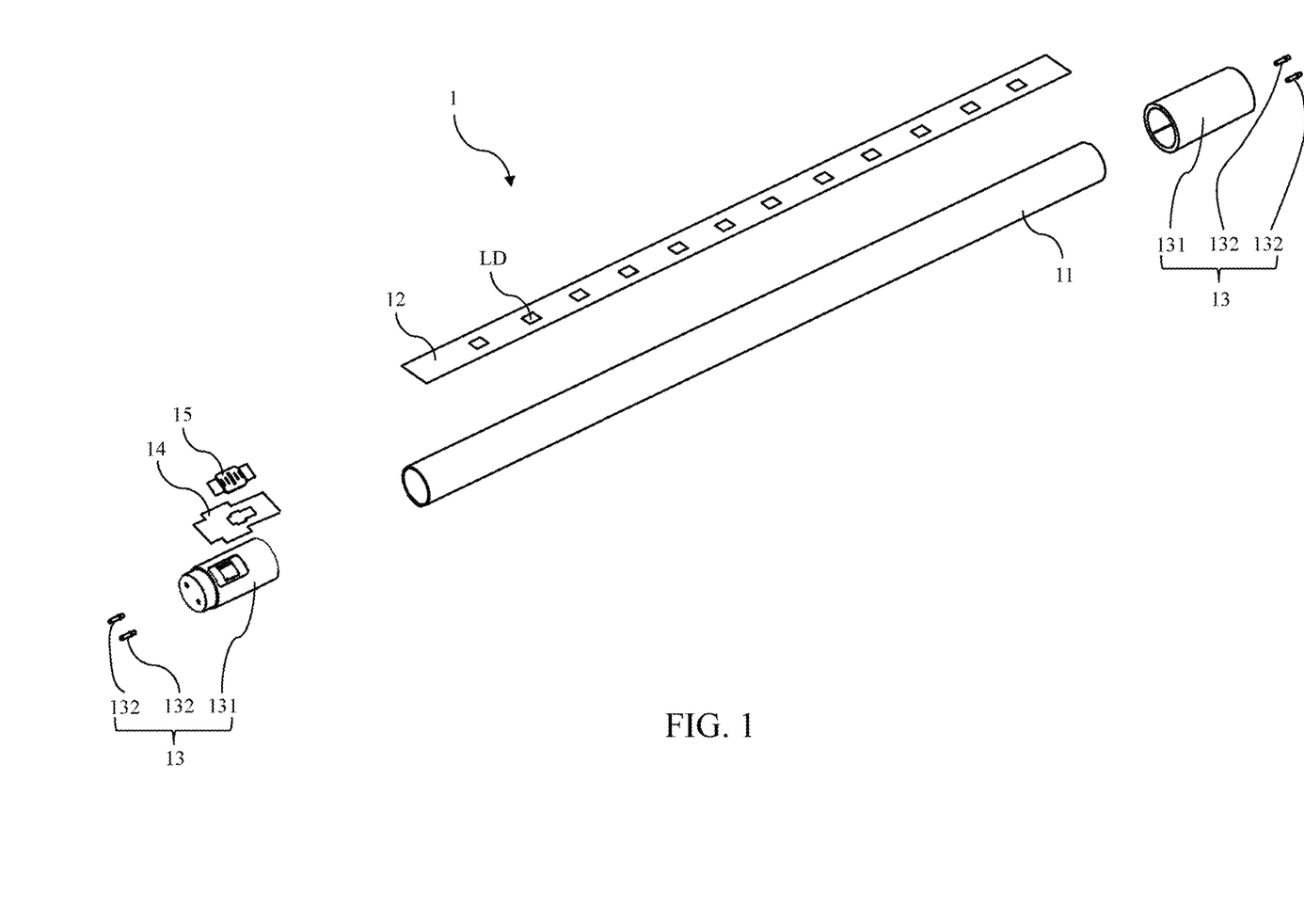
FIG. 1 is an exploded view of an LED lighting device in accordance with one embodiment of the present invention.
Figure 2:
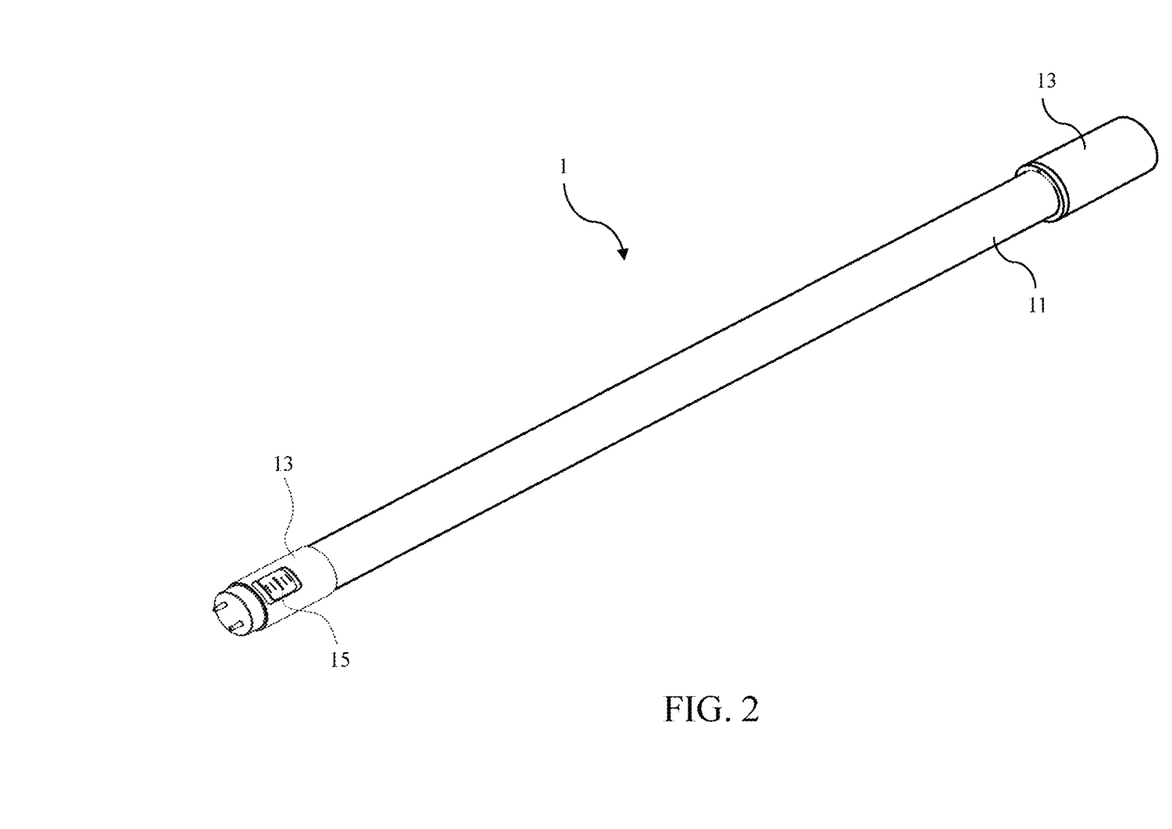
FIG. 2 is a perspective view of the LED lighting device in accordance with one embodiment of the present invention.

Please refer to FIG. 1 and FIG. 2. FIG. 1 is an exploded view of a light-emitting diode (LED) lighting device in accordance with one embodiment of the present invention. FIG. 2 is a perspective view of the LED lighting device in accordance with one embodiment of the present invention. As shown in FIG. 1 and FIG. 2, the LED lighting device 1 includes a light cover 11, a circuit board 12, two end caps 13, a power supplier 14, a color temperature switch 15 and a plurality of light sources LD. In this embodiment, the LED lighting device 1 is an LED light tube. In another embodiment, the LED lighting device 1 may be an LED panel light, LED ceiling light or other currently available lighting devices.

The circuit board 12 is disposed in the light cover 11. In this embodiment, the circuit board 12 is a flexible printed circuit board (FPCB). In another embodiment, the circuit board 12 is a printed circuit board. In this embodiment, the light cover 11 may be tubular. In another embodiment, the light cover 11 may be a flat circular box, a flat rectangular box, etc. In one embodiment, the light cover 11 may be made of a transparent material or a translucent material, such as plastics, glass, etc.

The two end caps 13 are disposed at the two ends of the light cover 12 and the power supplier 14 is disposed in one of the end caps 13 and electrically connected to the circuit board 12. Each of the end caps 13 includes a casing 131 and two metal pins 132 (e.g., copper, iron, aluminum, etc.). The metal pins 132 are disposed on the casing 131 and electrically connected to the power supplier 14 and the circuit board 12. In one embodiment, the power supplier 14 is an LED power supplier, which may include converters, rectifiers, filters and other necessary electronic components; the details of the power supplier 14 are known by those skilled in the art, so will not be described herein.

The light sources LD are disposed on the circuit board 12 and electrically connected to the circuit board 12. In this embodiment, the light sources LD are LEDs. In another embodiment, the light sources LD may be an LED light strip.

The color temperature switch 15 is disposed on one of the end caps 13 and connected to the power supplier 14. The user can operate the color temperature switch 15 to adjust the color temperature of the light sources LD. In another embodiment, the color temperature switch 15 may be replaced by a dimming switch, or the LED lighting device 1 may have both of the color temperature switch 15 and the dimming switch.

The embodiment just exemplifies the present invention and is not intended to limit the scope of the present invention; any equivalent modification and variation according to the spirit of the present invention is to be also included within the scope of the following claims and their equivalents.

Figure 3:
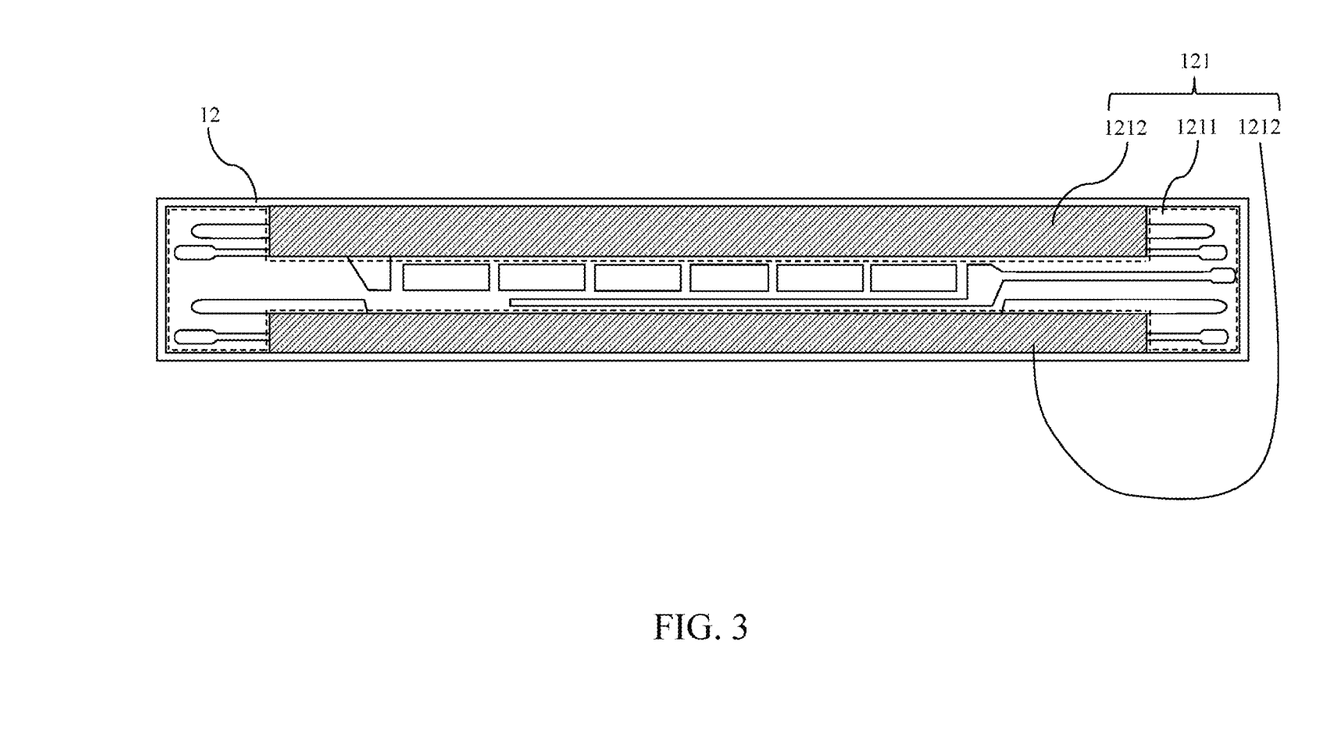
FIG. 3 is a first schematic view of a circuit board of the LED lighting device in accordance with one embodiment of the present invention.
Figure 4:
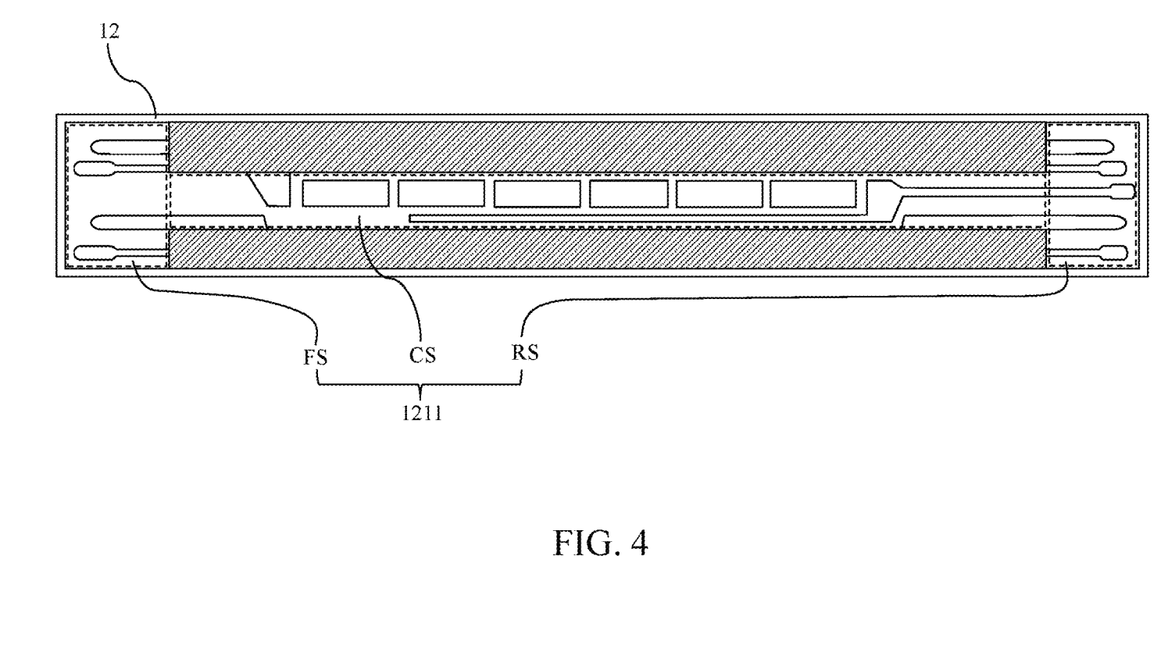
FIG. 4 is a second schematic view of the circuit board of the LED lighting device in accordance with one embodiment of the present invention.

Please refer to FIG. 3 and FIG. 4. FIG. 3 is a first schematic view of a circuit board of the LED lighting device in accordance with one embodiment of the present invention. FIG. 4 is a second schematic view of the circuit board of the LED lighting device in accordance with one embodiment of the present invention. As shown in FIG. 3, the circuit board 12 has a protective layer 121. The protective layer 121 includes an opening 1211 and two coated layers 1212. The coated layers 1212 may be ink layers capable of providing the insulating function and protecting the circuit board 12. The material of the coated layers 1212 is known by those skilled in the art, so will not be described herein.

As shown in FIG. 4, the opening 1211 includes a front section FS, a rear section RS and a connecting section CS. In this embodiment, the shape of the connecting section CS is a straight line. The front section FS is connected to the rear section RS via the connecting section CS, such that the opening 1211 can be H-shaped. The coated layers 1212 are disposed on the two sides of the connecting section CS respectively.

The embodiment just exemplifies the present invention and is not intended to limit the scope of the present invention; any equivalent modification and variation according to the spirit of the present invention is to be also included within the scope of the following claims and their equivalents.

Figure 5A:
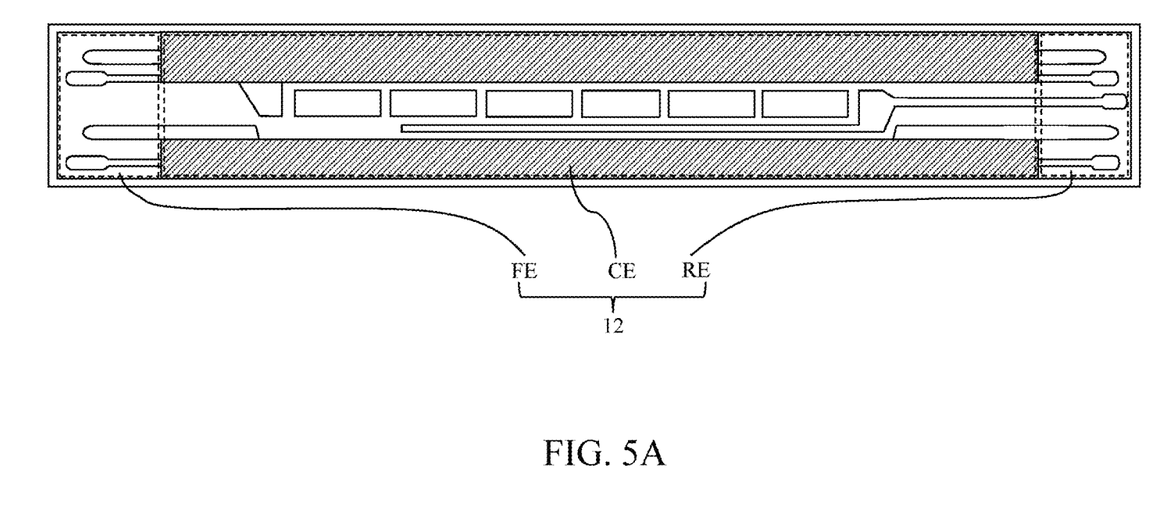
FIG. 5A is a third schematic view of the circuit board of the LED lighting device in accordance with one embodiment of the present invention.

Please refer to FIG. 5A, which is a third schematic view of the circuit board of the LED lighting device in accordance with one embodiment of the present invention. As shown in FIG. 5A, the circuit board 12 has a front soldering section FE, a rear soldering section RE and a circuit section CE. The front soldering section FE is electrically connected to the rear soldering section RE via the circuit section CE. The light sources LD are disposed on the circuit section CE and electrically connected to the circuit section CE. Any one of the coated layers 1212 of the protective layer 121 is separated from the front soldering section FE by a predetermined distance (in one embodiment, the predetermined distance may be greater than 4 m). Similarly, any one of the coated layers 1212 of the protective layer 121 is separated from the rear soldering section RE by the predetermined distance. The aforementioned predetermined distance can avoid that the halogen elements of the protective layer 121 move to the front soldering section FE and the rear soldering section RE of the circuit board 12.

The front soldering section FE has several connecting points, which may include a positive electrode, a negative electrode, a grounding point, etc. The rear soldering section RE also has the same structure. The circuit section CE has a plurality of traces. The light sources LD are disposed on the circuit board 12 and within the connecting section CE so as to electrically connect to the trances, such that the light sources LD can be electrically connected to the front soldering section FE and the rear soldering section RE via these traces.

As previously stated, the protective layer 121 of the circuit board 12 of the lighting device 1 have only one opening 1211. Therefore, the coating process of the protective layer 121 can be significantly simplified, such that the manufacturing cost of the LED lighting device 1 can be greatly reduced.

Besides, the above structural design can avoid that the halogen elements of the protective layer 121 move to the front soldering section FE and the rear soldering section RE of the circuit board 12. As a result, the front soldering section FE and the rear soldering section RE of the circuit board 12 will not be oxidized, which can make sure that the front soldering section FE and the rear soldering section RE of the circuit board 12 can achieve great conductivity and soldering effect during the manufacturing process.

In addition, the circuit board 12 of the LED lighting device 1 may further include a multi-function layer (not shown in the drawings). The multi-function layer can cover the opening 1211 of the protective layer 121 and the light sources LD disposed on the circuit board 12. The multi-function layer may be a transparent ink layer and can provide one or more of antioxidant function, insulating function, light reflecting function, moisture-proof function, etc. The material of the multi-function layer is known by those skilled in the art, so will not be described herein. Therefore, the LED lighting device 1 can have high reliability with a view to improving the overall quality thereof.

The embodiment just exemplifies the present invention and is not intended to limit the scope of the present invention; any equivalent modification and variation according to the spirit of the present invention is to be also included within the scope of the following claims and their equivalents.

Figure 5B:
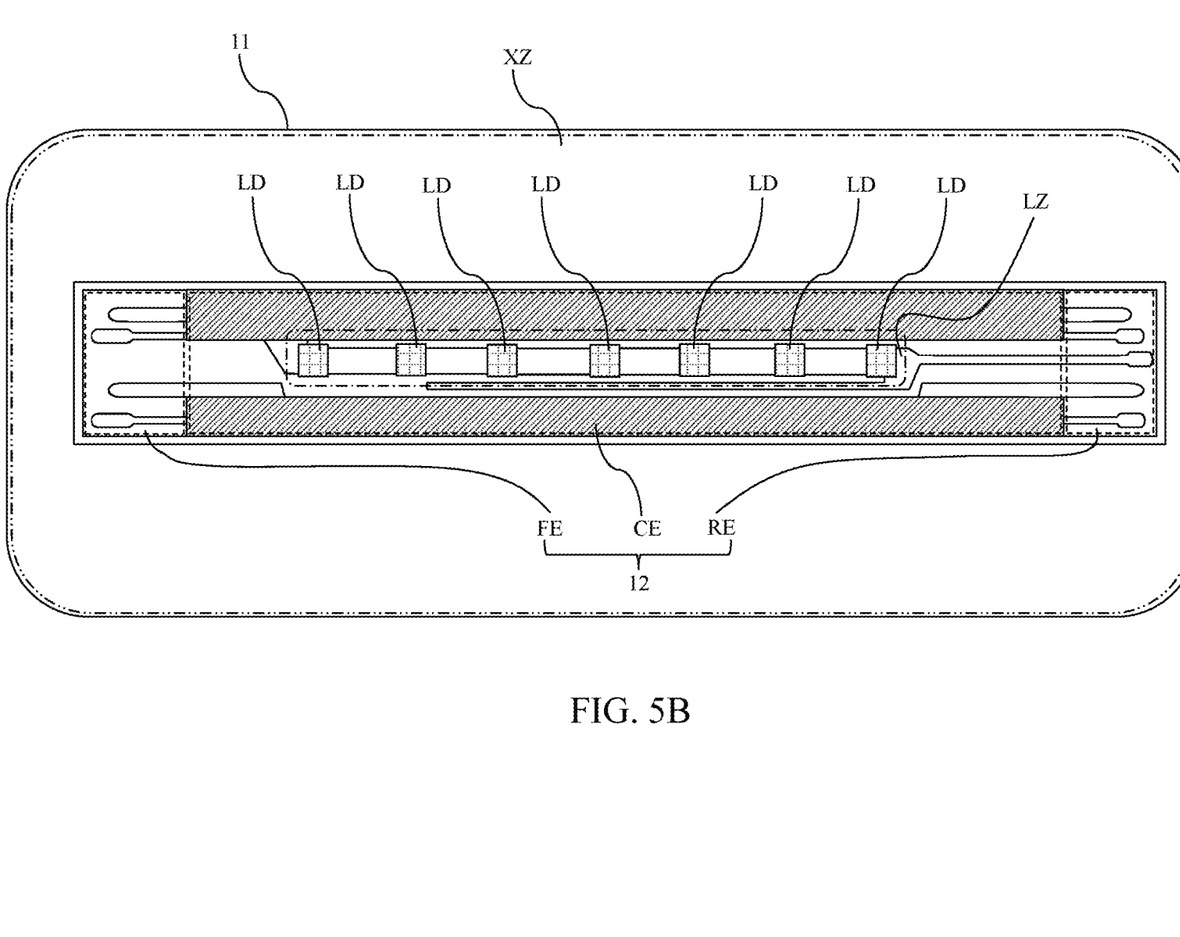
FIG. 5B is a fourth schematic view of the circuit board of the LED lighting device in accordance with one embodiment of the present invention.

Please refer to FIG. 5B, which is a fourth schematic view of the circuit board of the LED lighting device in accordance with one embodiment of the present invention. As shown in FIG. 5B, the circuit board 12 disposed in the light cover 11. The light sources LD are disposed within the connecting section CE, so a light-emitting zone LZ is formed (the light-emitting zone LZ is shown in FIG. 5B by one-point chain line; the light-emitting zone LZ stands for the zone which can emit light).

The light-emitting zone LZ can emit light, and the light can spread over the inner space of the light cover 11 to make the inner space of the light cover 11 form an optical zone XZ (the optical zone XZ is shown in FIG. 5B by two-point chain line; the optical zone XZ stands for the zone inside the light cover 11 filled with light). The optical section XZ simultaneously covers the light-emitting section LZ, the front soldering section FE and the rear soldering section RE.

Via the above optical structure design, the optical zone XZ of the light cover 11 can be further extended to cover the front soldering section FE and the rear soldering section RE of the circuit board 12 (the power supplier 14 is still outside the optical zone XZ), which can further expand the optical zone XZ of the light cover 11. Thus, the overall light-emitting area of the LED lighting device 1 can be significantly increased, so the light efficiency of the LED lighting device 1 can be enhanced.

The embodiment just exemplifies the present invention and is not intended to limit the scope of the present invention; any equivalent modification and variation according to the spirit of the present invention is to be also included within the scope of the following claims and their equivalents.

It is worthy to point out that the protective layer of the circuit board of a currently available LED light tube usually has a lot of openings and a plurality of LEDs are disposed in these openings respectively. Therefore, the coating process of the protective layer is very complicated and the halogen elements of the protective layer tend to move to the soldering sections of the circuit board. Accordingly, the soldering sections are prone to be oxidized, and the conductivity and the soldering effect thereof may be influenced during the manufacturing process. In addition, the currently available LED light tubes do not have a proper optical structure design, so the overall light-emitting areas of these lighting devices are limited can be significantly increased. Therefore, the light efficiency of these LED lighting devices is low. On the contrary, according to one embodiment of the present invention, the LED lighting device includes a power supplier, a light cover and a circuit board. The circuit board is disposed in the light cover. The circuit board has a protective layer disposed thereon and a plurality of light sources. The circuit board has a front soldering section, a rear soldering section and a circuit section. The front soldering section is electrically connected to the rear soldering section via the circuit section, and the front soldering section and the rear soldering section are electrically connected to the power supplier. The light sources are disposed on the circuit section and electrically connected to the circuit section. The protective layer includes an opening and two coated layers. The opening includes a front section, a rear section and a connecting section. The front section is connected to the rear section via the connecting section, and the coated layers are disposed on the two sides of the connecting section respectively. The light sources are within the connecting section to serve as a light-emitting zone. The light-emitting zone makes the inner space of the light cover serves as an optical zone, such that the optical zone simultaneously covers the light-emitting zone, the front soldering section and the rear soldering section. Via the above optical structure design, the optical zone of the light cover can be further extended to cover the front soldering section and the rear soldering section of the circuit board, which can further expand the optical zone of the light cover. Thus, the overall light-emitting area of the LED lighting device can be significantly increased, so the light efficiency of the LED lighting device can be enhanced.

According to one embodiment of the present invention, the structure design of the protective layer makes the protection layer have only one opening. Therefore, the coating process of the protective layer can be significantly simplified, such that the manufacturing cost of the LED lighting device can be greatly reduced.

Also, according to one embodiment of the present invention, any one of the coated layers of the protective layer is separated from the front soldering section by a predetermined distance and any one of the coated layers of the protective layer is separated from the rear soldering section by the predetermined distance. The above structural design can avoid that the halogen elements of the protective layer move to the front soldering section and the rear soldering section of the circuit board. As a result, the front soldering section and the rear soldering section of the circuit board will not be oxidized, which can make sure that the front soldering section and the rear soldering section of the circuit board can achieve great conductivity and soldering effect during the manufacturing process.

Further, according to one embodiment of the present invention, the structure of the protective layer can be applied to various LED lighting devices (e.g., LED light tube, LED panel light, LED ceiling light, etc.) so as to achieve great technical effect. Therefore, the structure of the protective layer can be more comprehensively in application and more flexible in use.

Moreover, according to one embodiment of the present invention, the circuit board of the LED lighting device further includes a multi-function layer, which covers the opening of the protective layer and the light sources disposed on the circuit board. The multi-function layer can provide antioxidant function, insulating function, light reflecting function and moisture-proof function. Thus, the reliability of the LED lighting device can be enhanced in order to improve the overall quality of the LED lighting device.

Furthermore, according to one embodiment of the present invention, the LED lighting device further has a dimming switch and/or a color temperature switch. Thus, the user can adjust the color temperature of the LED lighting device by operating the color temperature switch or adjust the brightness of the LED lighting device by operating the dimming switch. Accordingly, the LED lighting device can be more convenient in use. As set forth above, the LED lighting device according to the embodiments of the present invention can definitely achieve great technical effects.

Figure 6:
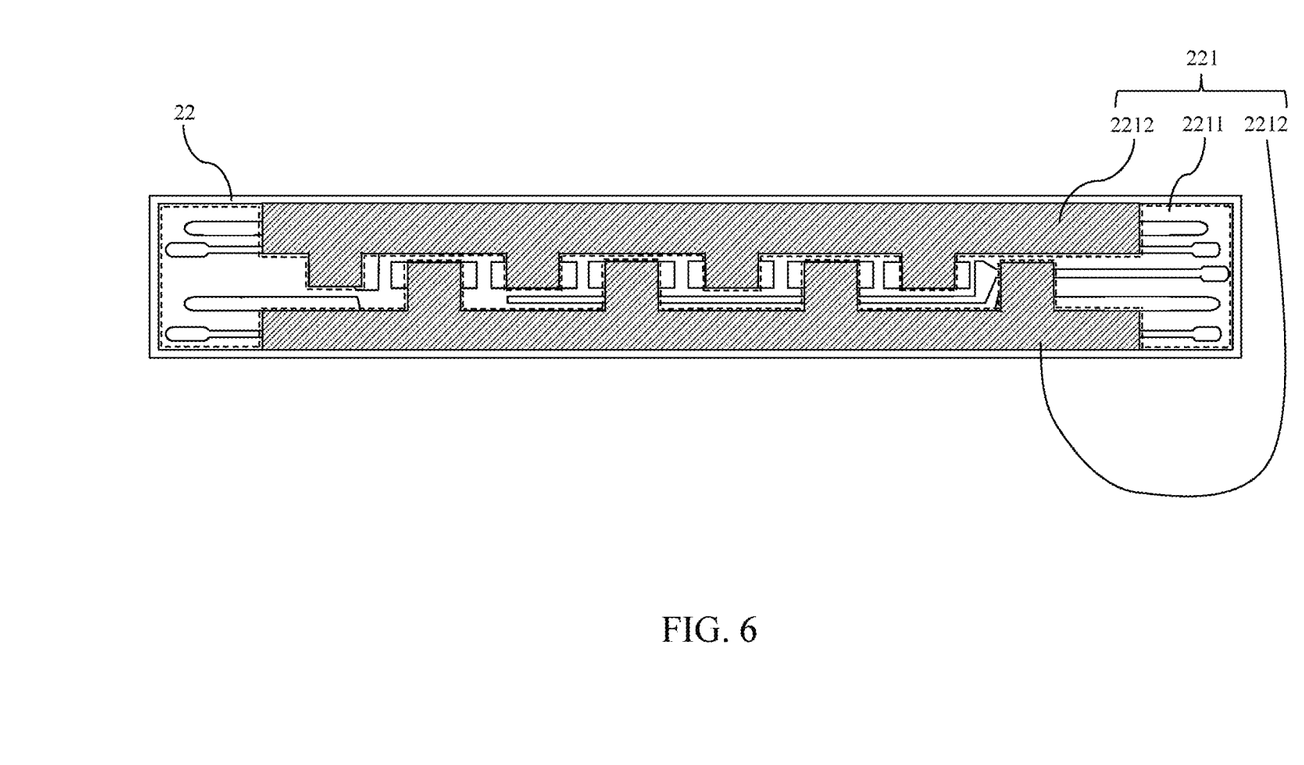
FIG. 6 is a first schematic view of a circuit board of the LED lighting device in accordance with another embodiment of the present invention.
Figure 7:
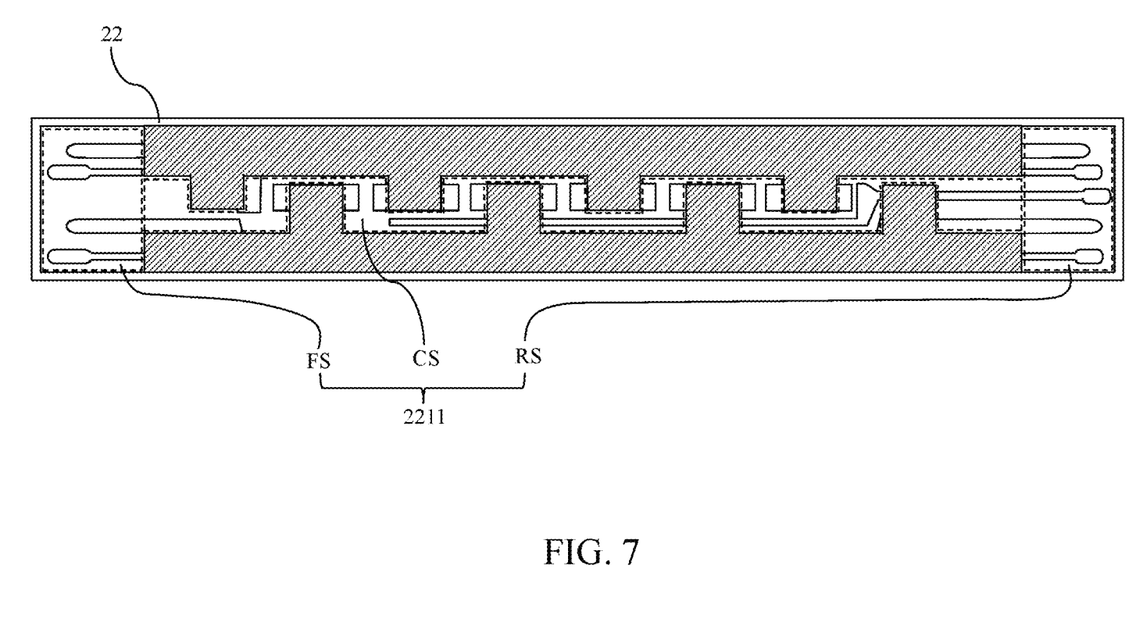
FIG. 7 is a second schematic view of the circuit board of the LED lighting device in accordance with another embodiment of the present invention.
Figure 8:
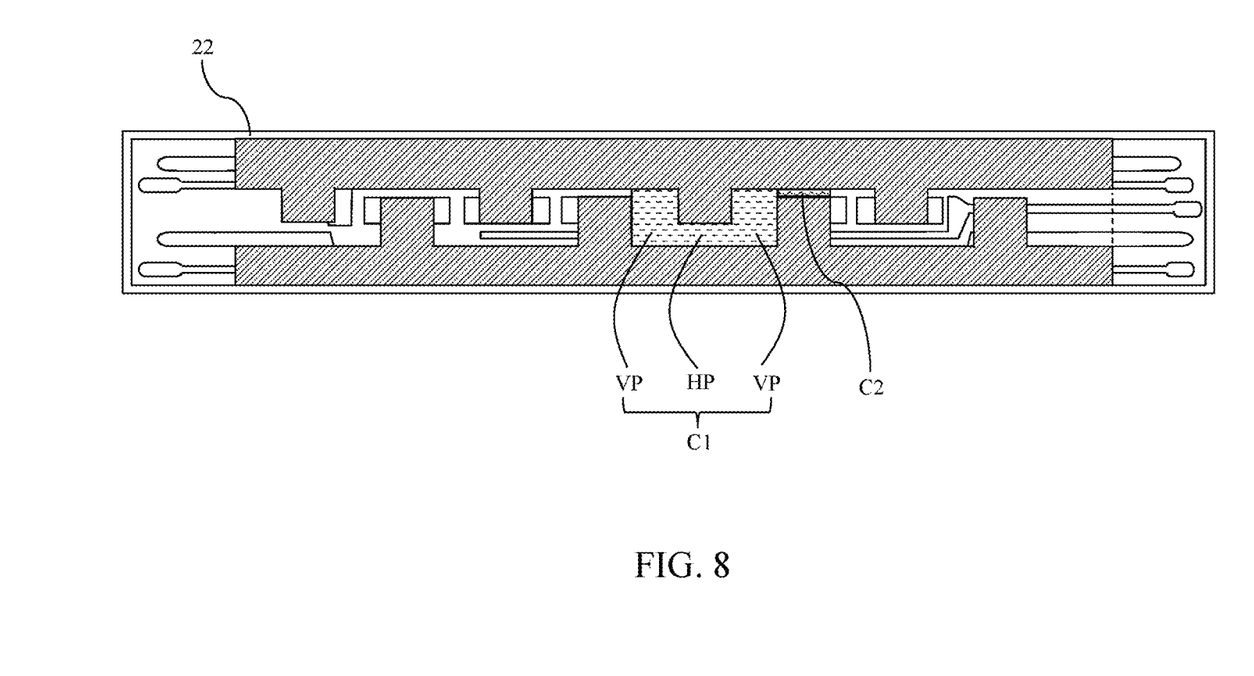
FIG. 8 is a third schematic view of the circuit board of the LED lighting device in accordance with another embodiment of the present invention.

Please refer to FIG. 6, FIG. 7 and FIG. 8. FIG. 6 is a first schematic view of a circuit board of the LED lighting device in accordance with another embodiment of the present invention. FIG. 7 is a second schematic view of the circuit board of the LED lighting device in accordance with another embodiment of the present invention. FIG. 8 is a third schematic view of the circuit board of the LED lighting device in accordance with another embodiment of the present invention. As shown in FIG. 6, the circuit board 22 has a protective layer 221. The protective layer 221 includes an opening 2211 and two coated layers 2212. Similarly, the coated layers 2212 may be ink layers capable of providing the insulating function and protecting the circuit board 22.

As shown in FIG. 7, the opening 2211 includes a front section FS, a rear section RS and a connecting section CS. The front section FS is connected to the rear section RS via the connecting section CS. The coated layers 2212 are disposed on the two sides of the connecting section CS respectively.

As shown in FIG. 8, the difference between this embodiment and the previous embodiment is that the connecting section CS of the opening 2211 includes a plurality of bending portions C1 and a plurality of connecting portions C2 connected to each other and arranged in an alternating order. Any one of the bending portions C1 is connected to the bending portion C1 adjacent thereto via one of the connecting portions C2.

In this embodiment, each of the bending portions C1 includes two vertical portions VP and a horizontal portion HP connected to each other and perpendicular to each other, such that the shape of the bending portion C1 is U-shaped. In another embodiment, the shape of the bending portion C1 may be inverted U-shaped. In still another embodiment, each of the bending portions C1 may have only one vertical portions VP and one horizontal portion HP connected to each other and perpendicular to each other. The structure of the bending portion C1 can be changed according to actual requirements.

Besides, the width of the horizontal portion HP is greater than the width of the connecting portion C2. In another embodiment, the width of the horizontal portion HP may be equal to or less than the width of the connecting portion C2. Therefore, in this embodiment, the shape of the connecting section CS is a rectangular wave. In another embodiment, the shape of the connecting section CS may be a sinusoidal wave. Of course, the shape of the connecting section CS can be changed according to actual requirements.

The embodiment just exemplifies the present invention and is not intended to limit the scope of the present invention; any equivalent modification and variation according to the spirit of the present invention is to be also included within the scope of the following claims and their equivalents.

Figure 9:
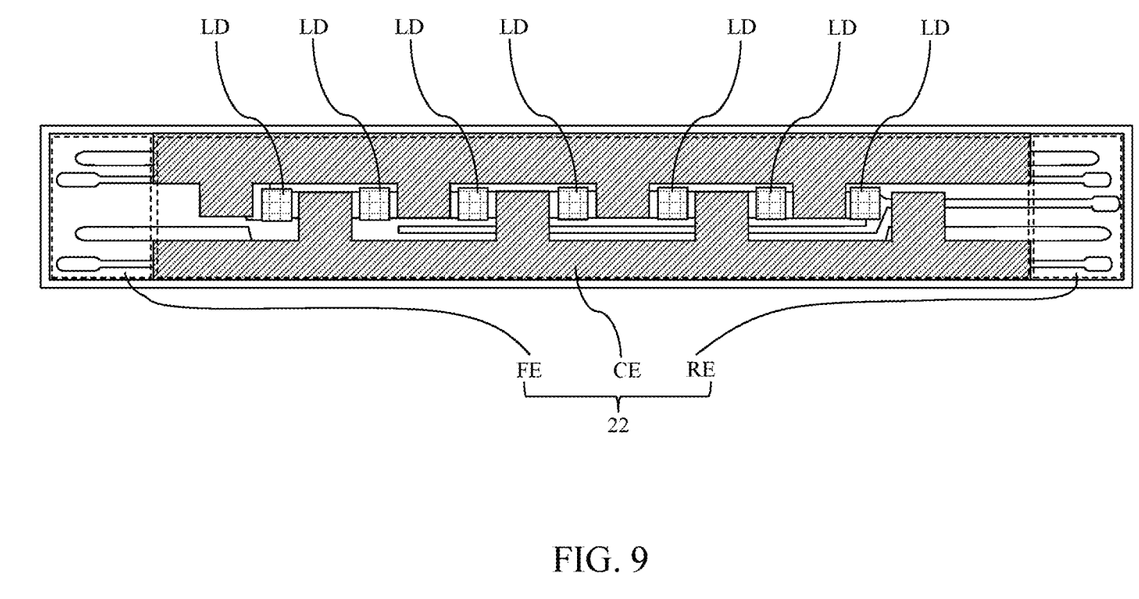
FIG. 9 is a fourth schematic view of the circuit board of the LED lighting device in accordance with one embodiment of the present invention.

Please refer to FIG. 9, which is a fourth schematic view of the circuit board of the LED lighting device in accordance with one embodiment of the present invention. As shown in FIG. 9, the circuit board 22 has a front soldering section FE, a rear soldering section RE and a circuit section CE. The front soldering section FE is electrically connected to the rear soldering section RE via the circuit section CE. The light sources LD are disposed on the circuit section CE (and within the connecting section CE) and electrically connected to the circuit section CE. Any one of the coated layers 2212 of the protective layer 221 is separated from the front soldering section FE by a predetermined distance (as set forth above, the predetermined distance may be greater than 4 m). Similarly, any one of the coated layers 2212 of the protective layer 221 is separated from the rear soldering section RE by the predetermined distance. The structure of the circuit board 22 is the same with that of the circuit board 22 of the previous embodiment, so will not be described herein again.

As previously stated, the protective layer 221 of the circuit board 22 have only one opening 2211. Therefore, the coating process of the protective layer 221 can be significantly simplified, such that the manufacturing cost of the LED lighting device can be greatly reduced.

Moreover, since the shape of the opening 2211 of the protective layer 221 is a rectangular wave (serrated), each of the coated layers 2212 has several protrusions, so the area of the protective layer 221 can increase. Accordingly, the protective layer 221 can cover more of the area of the surface of the circuit board 22 so as to more effectively protect the circuit board 22.

Similarly, the above structural design can avoid that the halogen elements of the protective layer 221 move to the front soldering section FE and the rear soldering section RE of the circuit board 22. As a result, the front soldering section FE and the rear soldering section RE of the circuit board 22 will not be oxidized, which can make sure that the front soldering section FE and the rear soldering section RE of the circuit board 22 can achieve great conductivity and soldering effect during the manufacturing process. The circuit board 22 may also include a multi-function layer (not shown in the drawings).

The embodiment just exemplifies the present invention and is not intended to limit the scope of the present invention; any equivalent modification and variation according to the spirit of the present invention is to be also included within the scope of the following claims and their equivalents.

To sum up, according to one embodiment of the present invention, the LED lighting device includes a power supplier, a light cover and a circuit board. The circuit board is disposed in the light cover. The circuit board has a protective layer disposed thereon and a plurality of light sources. The circuit board has a front soldering section, a rear soldering section and a circuit section. The front soldering section is electrically connected to the rear soldering section via the circuit section, and the front soldering section and the rear soldering section are electrically connected to the power supplier. The light sources are disposed on the circuit section and electrically connected to the circuit section. The protective layer includes an opening and two coated layers. The opening includes a front section, a rear section and a connecting section. The front section is connected to the rear section via the connecting section, and the coated layers are disposed on the two sides of the connecting section respectively. The light sources are within the connecting section to serve as a light-emitting zone. The light-emitting zone makes the inner space of the light cover serves as an optical zone, such that the optical zone simultaneously covers the light-emitting zone, the front soldering section and the rear soldering section. Via the above optical structure design, the optical zone of the light cover can be further extended to cover the front soldering section and the rear soldering section of the circuit board, which can further expand the optical zone of the light cover. Thus, the overall light-emitting area of the LED lighting device can be significantly increased, so the light efficiency of the LED lighting device can be enhanced.

According to one embodiment of the present invention, the structure design of the protective layer makes the protection layer have only one opening. Therefore, the coating process of the protective layer can be significantly simplified, such that the manufacturing cost of the LED lighting device can be greatly reduced.

Also, according to one embodiment of the present invention, any one of the coated layers of the protective layer is separated from the front soldering section by a predetermined distance and any one of the coated layers of the protective layer is separated from the rear soldering section by the predetermined distance. The above structural design can avoid that the halogen elements of the protective layer move to the front soldering section and the rear soldering section of the circuit board. As a result, the front soldering section and the rear soldering section of the circuit board will not be oxidized, which can make sure that the front soldering section and the rear soldering section of the circuit board can achieve great conductivity and soldering effect during the manufacturing process.

Further, according to one embodiment of the present invention, the structure of the protective layer can be applied to various LED lighting devices (e.g., LED light tube, LED panel light, LED ceiling light, etc.) so as to achieve great technical effect. Therefore, the structure of the protective layer can be more comprehensively in application and more flexible in use.

Moreover, according to one embodiment of the present invention, the circuit board of the LED lighting device further includes a multi-function layer, which covers the opening of the protective layer and the light sources disposed on the circuit board. The multi-function layer can provide antioxidant function, insulating function, light reflecting function and moisture-proof function. Thus, the reliability of the LED lighting device can be enhanced in order to improve the overall quality of the LED lighting device.

Furthermore, according to one embodiment of the present invention, the LED lighting device further has a dimming switch and/or a color temperature switch. Thus, the user can adjust the color temperature of the LED lighting device by operating the color temperature switch or adjust the brightness of the LED lighting device by operating the dimming switch. Accordingly, the LED lighting device can be more convenient in use.

It will be apparent to those skilled in the art that various modifications and variations can be made to the disclosed embodiments. It is intended that the specification and examples be considered as exemplary only, with a true scope of the present invention being indicated by the following claims and their equivalents.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light-emitting diode (LED) lighting device, comprising:
 a power supplier;
 a light cover; and
 a circuit board disposed in the light cover, and having a protective layer disposed thereon and a plurality of light sources, wherein the circuit board has a front soldering section, a rear soldering section and a circuit section, wherein the front soldering section is electrically connected to the rear soldering section via the circuit section, and the front soldering section and the rear soldering section are electrically connected to the power supplier, wherein the light sources are disposed on the circuit section and electrically connected to the circuit section;
 wherein the protective layer comprises an opening and two coated layers, and the opening comprises a front section, a rear section and a connecting section, wherein the front section is connected to the rear section via the connecting section, and the coated layers are disposed on two sides of the connecting section respectively, and the light sources are within the connecting section to serve as a light-emitting zone, wherein the light-emitting zone makes an inner space of the light cover forms an optical zone, whereby the optical zone simultaneously covers the light-emitting zone, the front soldering section and the rear soldering section.

2. The LED lighting device as claimed in claim 1, wherein the front section is connected to the rear section via the connecting section, whereby the opening is H-shaped.

3. The LED lighting device as claimed in claim 1, wherein the light sources are LEDs or an LED light strip.

4. The LED lighting device as claimed in claim 1, further comprising two end caps, wherein the two end caps are disposed at two ends of the light cover and the power supplier is disposed in one of the end caps.

5. The LED lighting device as claimed in claim 1, wherein the connecting section comprises a plurality of bending portions and a plurality of connecting portions connected to each other.

6. The LED lighting device as claimed in claim 5, wherein the bending portions and the connecting portions are arranged in an alternating order.

7. The LED lighting device as claimed in claim 5, wherein a shape of the bending portion is U-shaped or inverted U-shaped.

8. The LED lighting device as claimed in claim 5, wherein each of the bending portions comprises at least one vertical portion and a horizontal portion connected to each other and perpendicular to each other.

9. The LED lighting device as claimed in claim 8, wherein a width of the horizontal portion is greater than a width of the connecting portion.

10. The LED lighting device as claimed in claim 1, wherein the light cover is made of a transparent material or a semi-transparent material.

* * * * *